(12) United States Patent
Ma et al.

(10) Patent No.: US 6,235,560 B1
(45) Date of Patent: May 22, 2001

(54) SILICON-GERMANIUM TRANSISTOR AND ASSOCIATED METHODS

(75) Inventors: Yi Ma; Allen Yen, both of Orlando, FL (US)

(73) Assignee: Agere Systems Guardian Corp., Murray Hill, NJ (US)

( * ) Notice: Subject to any disclaimer, the term of this patent is extended or adjusted under 35 U.S.C. 154(b) by 0 days.

(21) Appl. No.: 09/375,150

(22) Filed: Aug. 16, 1999

(51) Int. Cl.[7] .................................................. H01L 21/00
(52) U.S. Cl. ........................ 438/150; 438/306; 438/52; 438/8
(58) Field of Search ............................ 438/150, 309–313, 438/322, 413, 416, 419, 429, 442, 481, 306; 257/592, 938, 281, 409

(56) References Cited

U.S. PATENT DOCUMENTS

| | | | |
|---|---|---|---|
| 5,296,387 | * | 3/1994 | Aronowitz .......................... 438/306 |
| 5,726,459 | | 3/1998 | Hsu et al. ............................. 257/55 |
| 5,879,996 | * | 3/1999 | Forbes .................................. 438/289 |

* cited by examiner

Primary Examiner—David Nelms
Assistant Examiner—Dung A Le
(74) Attorney, Agent, or Firm—Allen, Dyer, Doppelt, Milbrath & Gilchrist, P.A.

(57) ABSTRACT

A method for making a transistor includes the steps of providing a silicon substrate including a silicon-germanium epitaxial layer, forming a masking implant layer on a channel region of the silicon-germanium epitaxial layer, and implanting dopants into the silicon-germanium epitaxial layer using the masking implant layer to define spaced apart source and drain regions adjacent the channel region. The method further includes the step of removing the masking implant layer after the implanting to expose the channel region. A silicon epitaxial layer is formed on the exposed channel region, and at least a portion of the silicon epitaxial layer is converted to silicon oxide to define a gate dielectric layer for the transistor. The gate dielectric layer includes a gate oxide layer, and a silicon protection layer between the gate oxide layer and the channel region. A conductive gate is formed on an upper surface of the gate oxide layer. Since the gate dielectric layer does not include germanium, a stable gate dielectric layer is provided for the high speed silicon-germanium transistor.

35 Claims, 4 Drawing Sheets

SILICON-GERMANIUM TRANSISTOR AND ASSOCIATED METHODS

FIELD OF THE INVENTION

The present invention relates to the field of semiconductor devices, and, more particularly, to a transistor fabrication method and a corresponding transistor produced thereby.

BACKGROUND OF THE INVENTION

Carrier mobility is the speed of movement of an electron or hole through the channel region of a transistor. This is an important property for high speed transistors. The higher the carrier mobility, the higher the operating frequency of the transistor. The addition of germanium dopant impurities in a silicon substrate increases channel mobility over that of pure silicon.

Conventional silicon transistor gates are formed by thermally oxidizing the silicon substrate. A thermally grown gate oxide is typically formed by exposing the silicon substrate surface to an oxygen containing ambient. The oxygen causes the silicon surface to be partially consumed and converted into the gate oxide. Unfortunately, a stable gate oxide can not be readily formed from a silicon-germanium substrate because germanium becomes unstable at high temperatures. In other words, the germanium begins to diffuse from the silicon at high temperatures, and consequently, does not retain the properties exhibited at low temperatures. Thus, oxide should not be present at the silicon-germanium interface because the germanium bond is not stable under normal operating conditions. The diffused germanium would create interface trap sites in the gate oxide which may severely limit the electrical performance of the transistor.

One approach to forming a stable gate oxide over a silicon-germanium substrate includes depositing a low temperature CVD oxide. However, such an oxide has a resulting undesirable higher surface state density. Another way of forming a stable gate oxide over a silicon-germanium substrate is by reoxidation of a silicon cap layer applied over the silicon-germanium substrate. Using a silicon cap layer results in a buried channel structure with an undesirably large effective gate oxide thickness.

Nonetheless, silicon-germanium transistors are desirable because of the higher operating speeds that can be achieved as compared to the operating speeds of silicon transistors.

SUMMARY OF THE INVENTION

In view of the foregoing background, it is therefore an object of the present invention to provide a silicon-germanium transistor fabrication method and a corresponding silicon-germanium transistor having a stable gate oxide that is relatively thin.

This and other objects, advantages and features in accordance with the present invention are provided by a method for making a transistor preferably comprising the steps of providing a silicon substrate having a silicon-germanium epitaxial layer, forming a masking implant layer on a channel region of the silicon-germanium epitaxial layer, and implanting dopants into the silicon-germanium epitaxial layer using the masking implant layer to define spaced apart source and drain regions adjacent the channel region.

The method further includes the steps of removing the masking implant layer after the implanting to expose the channel region, and forming a silicon epitaxial layer on the exposed channel region. At least a portion of the silicon epitaxial layer is preferably converted into silicon oxide to define a gate dielectric layer using either plasma enhanced chemical vapor deposition (PECVD) or high pressure oxidation. Both steps are performed at low temperatures to prevent the migration of germanium from the channel region to the gate dielectric layer when the silicon oxide is formed. A conductive gate is formed on an upper surface of the gate dielectric layer.

The source and drain regions are thus formed before the silicon oxide is formed. This is so since the method preferably further includes the step of subjecting the silicon substrate having the silicon-germanium epitaxial layer to high temperatures to activate the implanted ions in the source and drain regions, and to repair damage done during the implantation process. Otherwise, if the silicon oxide was formed before the source and drain regions are formed, germanium would become diffused from the silicon and migrate to the gate dielectric layer when the silicon substrate having the silicon-germanium epitaxial layer is subjected to the high temperatures. Oxidation of germanium would create an unstable gate dielectric layer.

In one embodiment, only a portion of the silicon epitaxial layer is preferably converted to silicon oxide to define the gate dielectric layer. Accordingly, the gate dielectric layer comprises a gate oxide layer and a silicon protection layer between the gate oxide layer and the channel region. The silicon protection layer advantageously prevents germanium from the channel region from migrating to the gate oxide layer under high temperatures.

Another aspect of the invention relates to a silicon-germanium transistor comprising a silicon substrate including a silicon-germanium epitaxial layer having a channel region, and a pair of spaced apart source and drain regions adjacent the channel region. A gate dielectric layer is on the channel region. The gate dielectric layer preferably includes a gate oxide layer adjacent the channel region, and a silicon protection layer between the gate oxide layer and the channel region. A conductive gate is on an upper surface of the gate oxide layer.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. The dimensions of layers and regions may be exaggerated in the figures for greater clarity.

Figure 1:
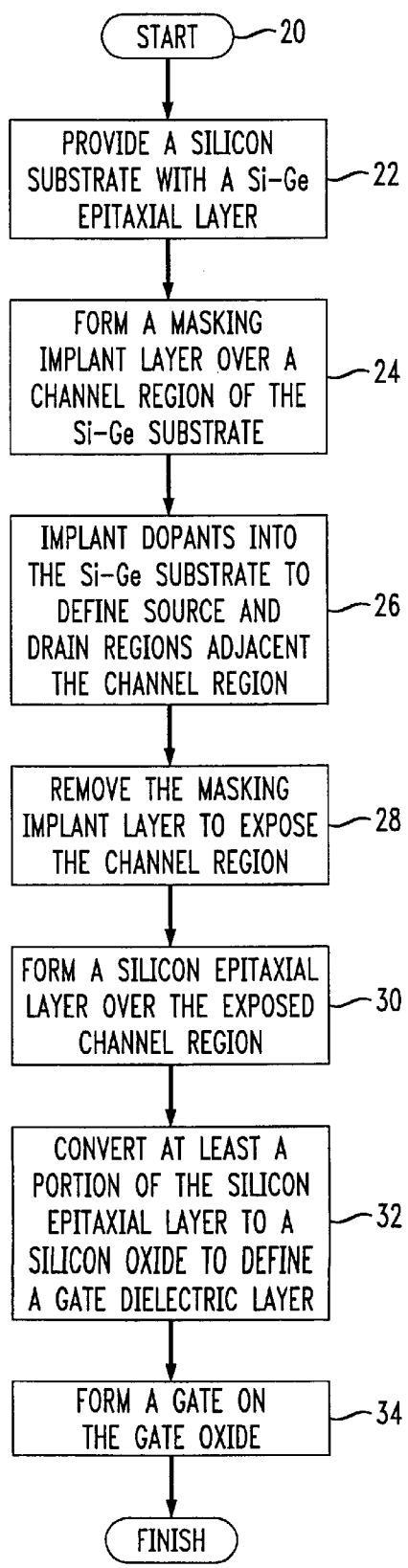
FIG. 1 is a flow chart illustrating the method for making a silicon-germanium transistor in accordance with the present invention.

Referring now to FIG. 1, a method for making a transistor on a silicon substrate including a silicon-germanium epitaxial layer in accordance with the present invention is first generally described. From the start (Block 20), a silicon substrate including the silicon-germanium epitaxial layer is provided at Block 22, and a masking implant layer is formed on a channel region of the silicon-germanium epitaxial layer at Block 24. Dopants are implanted into the silicon-germanium epitaxial layer using the masking implant layer to define spaced apart source and drain regions adjacent the channel region at Block 26. The masking implant layer is removed after the implanting to expose the channel region at Block 28. A silicon epitaxial layer is formed on the exposed channel region at Block 30.

The method further includes the step of converting at least a portion of the silicon epitaxial layer to silicon oxide to define a gate dielectric layer for the transistor at Block 32. The gate dielectric layer comprises a gate oxide layer, and a silicon protection layer between the gate oxide layer and the channel region. The silicon protection layer prevents germanium from being oxidized. A conductive gate is formed on an upper surface of the gate oxide layer at Block 34.

The method according to the present invention advantageously provides a stable gate dielectric layer for the silicon-germanium transistor because the gate dielectric layer does not contain germanium. Thus, oxide should not be present at the silicon-germanium interface because the germanium bond is not stable under normal operating conditions. Preventing germanium from migrating to the gate dielectric layer from the channel region when the silicon substrate including the silicon-germanium epitaxial layer is exposed to high temperatures improves the stability of the gate dielectric layer, and the reliability of the silicon-germanium transistor.

Figure 2:
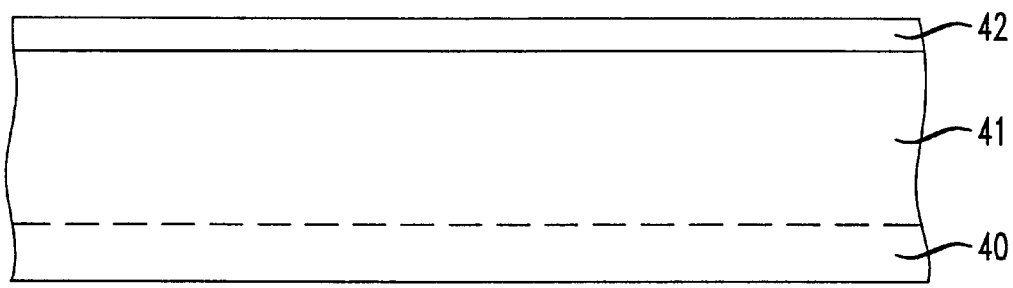
FIGS. 2–6 are cross-sectional views of a portion of an integrated circuit illustrating the process steps in accordance with the present invention.

Having now described the method generally as above, further details of the method are now discussed with reference to the cross-sectional views of FIGS. 2–6. A silicon-germanium layer 41 is formed by epitaxially depositing silicon-germanium on a silicon substrate 40, as readily understood by one skilled in the art. The silicon substrate 40 preferably includes heavily doped boron, as readily appreciated by one skilled in the art. The silicon-germanium epitaxial layer 41 has a thickness of about 5 microns. The concentration of germanium in the silicon-germanium epitaxial layer 41 is in a range of about 30 to 60% by weight percentage, with a preferred germanium concentration of about 50% by weight percentage. The 30 to 60% by weight percentage range provides high carrier mobility in the channel region of the transistor to be formed therein without significantly altering other substrate properties. However, the present invention is not limited to this range. A sacrificial oxide level 42 used for dopant implantations is optionally formed on the silicon-germanium epitaxial layer 41, as shown in FIG. 2. A thickness of the sacrificial oxide layer 42 is less than about 2 nm.

Figure 3:
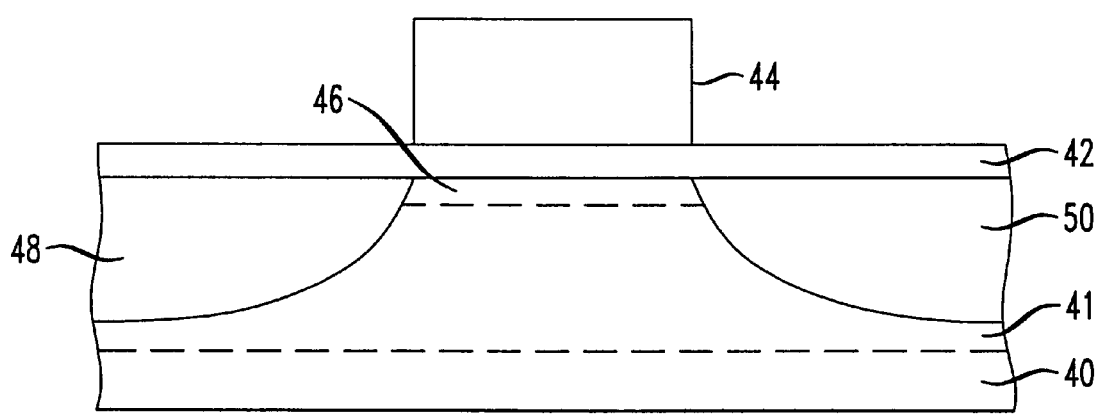

Referring now to FIG. 3, a masking implant layer 44 is formed over a channel region 46 in the silicon-germanium epitaxial layer 41. In one embodiment, the masking implant layer 44 is polysilicon. A thickness of the masking implant layer 44 is preferably in a range of about 50 to 100 nm. The purpose of the masking implant layer 44 is to prevent dopant impurities from entering the channel region 46 when source and drain regions 48, 50 are formed. Deposition and etching of the masking implant layer 44 are well known by one skilled in the art and will not be discussed in further detail herein.

Still referring to FIG. 3, dopants are implanted into the silicon-germanium epitaxial layer 41 using the masking implant layer 44 to define the spaced apart source and drain regions 48, 50 adjacent the channel region 46. The source and drain regions 48, 50 may be formed by a variety of methods, such as simple implantations, lightly doped drain (LDD) implantations, halo implantations, and using oxide or nitride spacers, as readily understood by one skilled in the art. In one embodiment, the implantations for the source and drain regions 48, 50 are shallow junction implants carried out at an energy within a range of about 5 to 15 keV using a dose within a range of about $5E14/cm^2$ to $1E16/cm^2$.

After the source and source regions 48, 50 have been formed, a high temperature process is desirable to activate the implanted ions, and to repair damage done to the silicon-germanium lattice caused by the bombardment of the high energy ions used in the implantation process. While high temperature is desirable to achieve these benefits, high temperatures can also result in the undesirable redistribution of the implanted ions. To achieve the desired benefits of high temperature processing while avoiding the redistribution of the implants, a rapid thermal anneal process may be used. Therefore, a rapid thermal anneal step, preferably performed at a temperature of approximately 1,000–1,075° C., may be performed after the implant step.

In conventional transistor formation methods, the source and drain regions 48, 50 are formed after the gate dielectric layer is formed. However, because of the germanium in the silicon-germanium epitaxial layer 41, the germanium would migrate to the gate dielectric layer in the high temperature process as discussed above. If germanium were present in the gate dielectric layer, this would cause the gate dielectric layer to become unstable, and consequently, reduce the reliability of the transistor. The masking implant layer 44 thus acts as a dummy gate dielectric layer and prevents dopant implants from entering the channel region 46 when the source and drain regions 48, 50 are formed.

Figure 4:
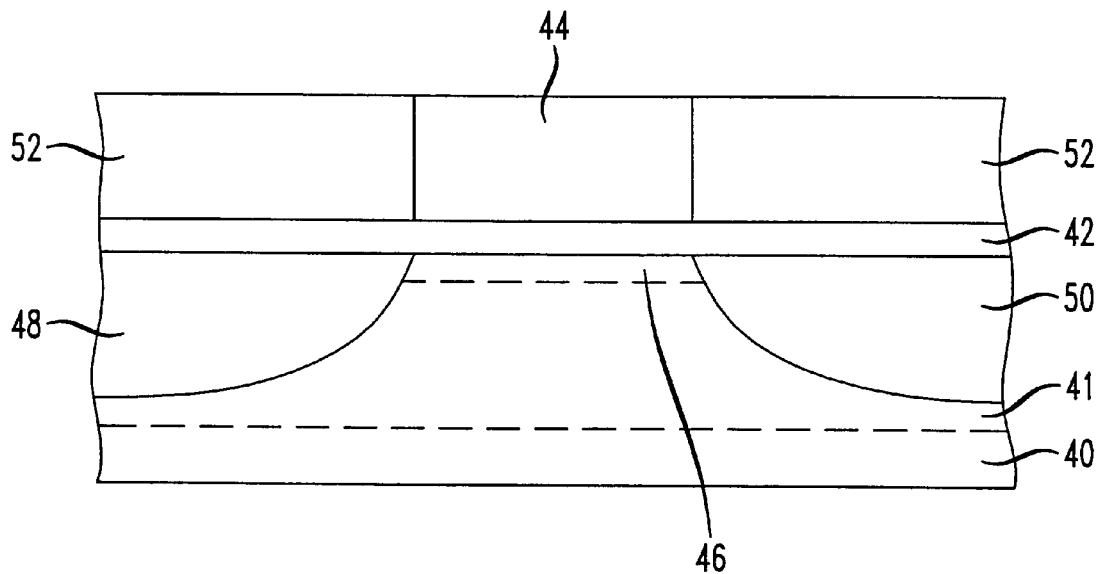

After the silicon substrate 40 and the silicon-germanium epitaxial layer 41 are annealed, a nonconducting layer of silicon dioxide 52 is formed over the silicon-germanium epitaxial layer 41, including the masking implant layer 44. A step of chemical mechanical polishing (CMP) is then performed to planarize the silicon dioxide 52 with the masking implant layer 44, as shown in FIG. 4. The silicon dioxide layer 52 allows the masking implant layer 44 to be selectively removed to expose the channel region 46. The silicon dioxide layer 52 also prevents the silicon epitaxial layer from coming in contact with the source and drain regions 48, 50.

The silicon dioxide layer 52 is deposited, as readily understood by one skilled in the art. Deposition of the silicon dioxide may be performed by low pressure chemical vapor deposition (CVD), by high density plasma CDV, or by a non-CVD molecular beam epitaxy (MBE) used for low-temperature deposition of thin films in a very controlled process.

Figure 5:
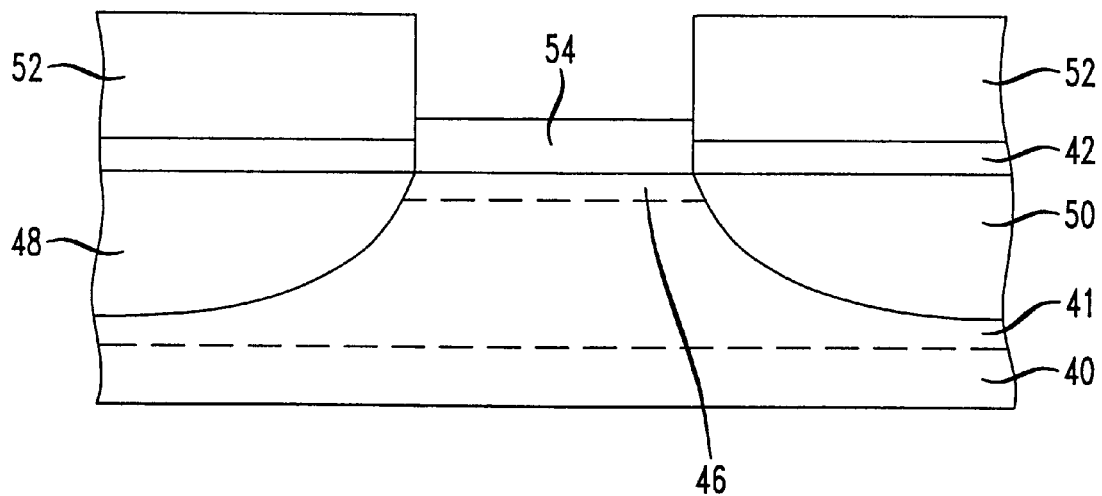

Next, the masking implant layer 44 and the sacrificial oxide layer 42 are removed to expose the channel region 46. These layers may be removed by either a wet or dry etch, as readily understood by one skilled in the art. With the exposed channel region 46, a silicon epitaxial layer 54 is formed over the channel region using low temperature, as shown in FIG. 5.

A thickness of the silicon epitaxial layer 54 is preferably within a range of about 0.5 to 3 nm. The low temperature is within a range of about 250 to 600° C., with a preferred temperature of about 500° C. Formation of the silicon epitaxial layer 54 may be either selective or non-selective since the silicon dioxide layer 52 and the sacrificial oxide level 42 overlying the source and drain regions 48, 50 will subsequently be removed after the silicon epitaxial layer is formed.

Figure 6:
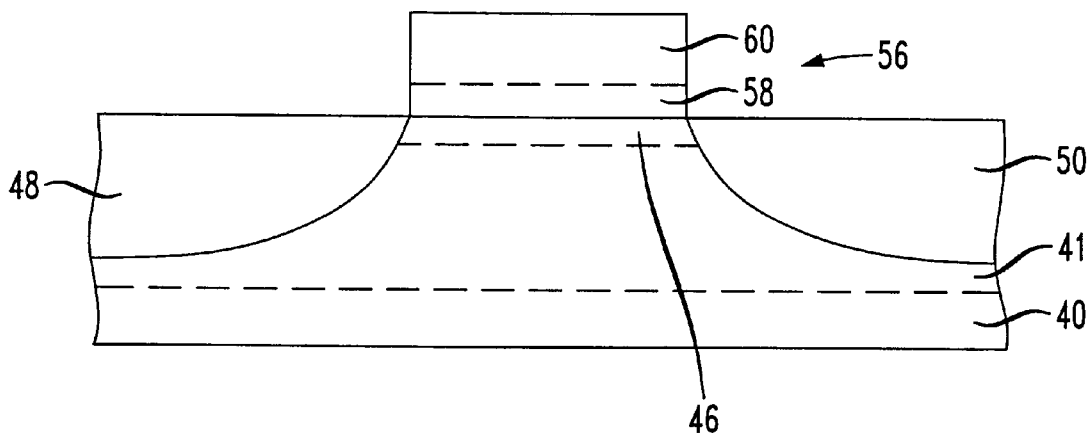

At least a portion of the silicon epitaxial layer 54 is converted to silicon oxide to define a stable gate dielectric layer 56, as shown in FIG. 6. The gate dielectric layer 56 is preferably formed using a low thermal budget process, such as plasma enhanced CVD or high pressure oxidation. The gate dielectric layer 56 includes a silicon protection layer 58 and a gate oxide layer 60. The silicon protection layer 58 has a thickness in a range of about 0.5 to 2.5 nm, with a preferred thickness of about 1 nm. The silicon protection layer 58 prevents germanium from migrating from the channel region 46 to the gate oxide layer 60 under high temperatures. A thickness of the gate oxide layer 60 is preferably in a range of about 1 to 10 nm so that the overall thickness of the gate dielectric layer 56 is within a range of about 1.5 to 12.5 nm. Post oxidation anneal reduces interface trap site densities within the gate dielectric layer 56, as readily appreciated by one skilled in the art.

Referring to Table 1 below, representative plasma enhanced CVD parameters are provided for forming the gate dielectric layer 56. For each parameter listed, a corresponding range is provided along with a preferred value. For example, the deposition temperature for the PECVD may be in a range of about 250° C. to 600° C., with a preferred temperature of about 300° C. The duration of the oxidation is in a range of about 10 to 60 seconds, with a preferred duration of about 45 seconds corresponding to the preferred temperature deposition of about 300° C. With respect to the frequency of the main plasma power source, a frequency of 13.56 MHz at a power level in a range of about 10 watts to 500 watts is provided. A preferred power level at the frequency of 13.56 MHz is 65 watts. The plasma includes argon, and the flow rate of argon is selected from a range of about 1 sccm to 500 sccm. A preferred flow rate of argon is about 50 sccm.

The plasma is also excited with a low frequency power source to reduce surface damage. The frequency of this power source may be in a range of about 50 kHz to 400 kHz, with a preferred frequency of about 200 kHz. The corresponding power level is in a range of about 5 watts to 500 watts. A preferred power level at the frequency of 200 kHz is 40 watts. Pressure within a plasma enhanced chemical vapor deposition system is in a range of about 1 mTorr to 500 Torr, with a preferred pressure of 3 Torr.

TABLE 1

| Parameters | Range | Preferable |
| --- | --- | --- |
| Deposition temperature | 250° C.–600° C. | 300° C. |
| Plasma Power (13.56 MHz) | 10 watts–500 watts | 65 watts |
| Plasma power (200 kHz) | 5 watts–500 watts | 40 watts |
| Pressure | 1 mTorr–500 Torr | 3 Torr |
| Argon | 1 sccm–500 sccm | 50 sccm |
| Time | 10–60 seconds | 45 seconds |

As an alternative to forming the gate dielectric layer 56 using plasma enhanced CVD, high pressure oxidation may be used. Table 2 list the high pressure oxidation parameters, along with a preferred parameter. The pressure is within a range of about 3 to 30 atmospheres, with a preferred pressure of 25 atmospheres. The oxidation temperature is in a range of about 500° C. to 700° C. A preferred oxidation temperature is 600° C. A time duration for performing the high pressure oxidation is in a range of about 90 seconds to 15 minutes, with a preferred time of 2 minutes corresponding to the preferred pressure of 25 atmospheres. The flow rate of oxygen is selected from a range of about 1 sccm to 500 sccm, with a preferred flow rate of about 50 sccm.

TABLE 2

| Parameters | Range | Preferable |
| --- | --- | --- |
| Oxidation temp. | 500°–700° C. | 600° C. |
| Pressure | 3–30 atmospheres | 25 atmospheres |
| $O_2$ | 1 sccm–500 sccm | 50 sccm |
| Time | 90 sec.–15 min. | 2 min. |

Figure 7:
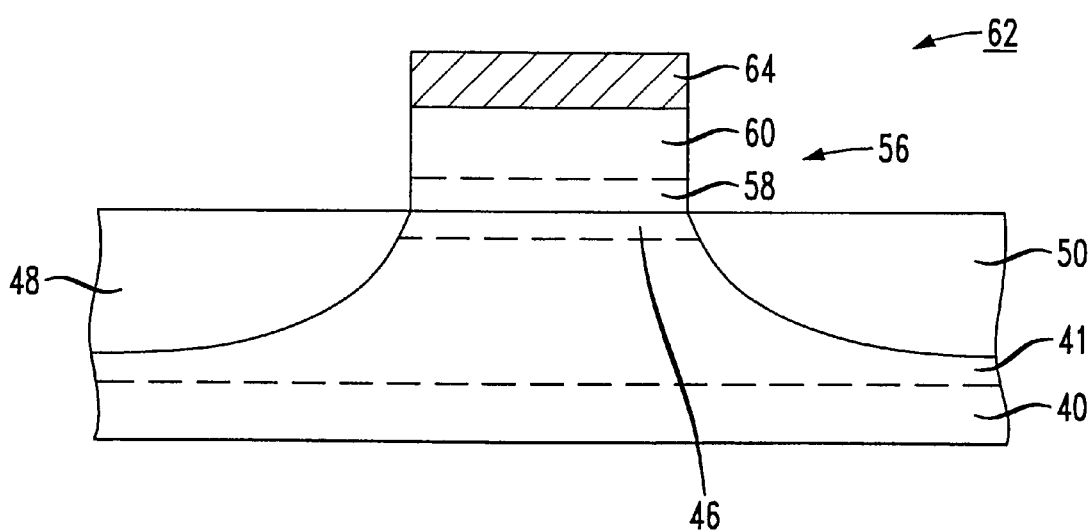
FIG. 7 is a cross-sectional view of a silicon-germanium transistor in accordance with the present invention.

A subsequent step for forming the silicon-germanium transistor 62 is to form a conductive gate 64 on an upper surface of the gate oxide layer 60, as shown in FIG. 7. The conductive gate 64 is aligned over the gate dielectric layer 56. Such a conductive gate structure 64 is well known by one skilled in the art, and is typically formed by depositing polysilicon upon the upper surface of the gate oxide layer 60 at low pressure using a chemical vapor deposition process, as readily known by one skilled in the art.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A method for making a transistor comprising:
   providing a silicon substrate comprising a silicon-germanium epitaxial layer;
   forming a masking implant layer on a channel region of the silicon-germanium epitaxial layer;
   implanting dopants into the silicon-germanium epitaxial layer using the masking implant layer to define spaced apart source and drain regions adjacent the channel region;
   removing the masking implant layer after the implanting to expose the channel region;
   forming a silicon epitaxial layer on the exposed channel region;
   converting at least a portion of the silicon epitaxial layer to silicon oxide to define a gate dielectric layer for the transistor; and
   forming a conductive gate on the gate dielectric layer.

2. A method according to claim 1, wherein converting comprises converting only a portion of the silicon epitaxial layer to the silicon oxide so that a silicon protection layer remains between the gate dielectric layer and the channel region.

3. A method according to claim 2, wherein the silicon protection layer has a thickness in a range of about 0.5 to 2.5 nm.

4. A method according to claim 1, wherein converting comprises converting 75 to 95% of a thickness of the silicon epitaxial layer into the silicon oxide.

5. A method according to claim 1, wherein the silicon epitaxial layer has a thickness in a range of about 0.5 to 3 nm.

6. A method according to claim 1, wherein the silicon-germanium epitaxial layer comprises about 30 to 60% germanium by weight percentage.

7. A method according to claim 1, further comprising annealing the silicon substrate comprising the silicon-germanium epitaxial layer before forming the silicon epitaxial layer on the exposed channel region.

8. A method according to claim 1, wherein the masking implant layer comprises polysilicon.

9. A method according to claim 1, wherein forming the silicon epitaxial layer is performed at a temperature less than about 600° C.

10. A method according to claim 1, wherein converting is performed using plasma enhanced chemical vapor deposition (PECVD).

11. A method according to claim 10, wherein the PECVD is performed at a temperature less than about 600° C.

12. A method according to claim 1, wherein converting is performed using oxidation at a pressure in a range of about 5 to 25 atmospheres.

13. A method according to claim 12, wherein the oxidation is performed at a temperature less than about 700° C.

14. A method for making a transistor comprising:
- forming a masking implant layer on a channel region of a silicon-germanium epitaxial layer on a silicon substrate;
- implanting dopants into the silicon-germanium epitaxial layer using the masking implant layer to define spaced apart source and drain regions adjacent the channel region;
- removing the masking implant layer after the implanting to expose the channel region;
- forming a silicon epitaxial layer on the exposed channel region; and
- converting only a portion of the silicon epitaxial layer to silicon oxide to define a gate dielectric layer for the transistor, the gate dielectric layer comprising a gate oxide layer and a silicon protection layer between the gate oxide layer and the channel region.

15. A method according to claim 14, further comprising forming a conductive gate on the gate oxide layer.

16. A method according to claim 14, wherein converting comprises converting 75 to 95% of a thickness of the silicon epitaxial layer into the silicon oxide.

17. A method according to claim 14, wherein the silicon protection layer has a thickness in a range of about 0.5 to 2.5 nm.

18. A method according to claim 14, wherein the silicon epitaxial layer has a thickness in a range of about 0.5 to 3 nm.

19. A method according to claim 14, wherein the silicon-germanium epitaxial layer comprises 30 to 60% germanium by weight percentage.

20. A method according to claim 14, further comprising annealing the silicon-germanium epitaxial layer on the silicon substrate before forming the silicon epitaxial layer on the exposed channel region.

21. A method according to claim 14, wherein the masking implant layer comprises polysilicon.

22. A method according to claim 14, wherein forming the silicon epitaxial layer is performed at a temperature less than about 600° C.

23. A method according to claim 14, wherein converting is performed using plasma enhanced chemical vapor deposition (PECVD).

24. A method according to claim 23, wherein the PECVD is performed at a temperature less than about 600° C.

25. A method according to claim 14, wherein converting is performed using oxidation at a pressure in a range of about 5 to 25 atmospheres.

26. A method according to claim 25, wherein the high pressure oxidation is performed at a temperature less than about 700° C.

27. A method for making a transistor comprising:
- providing a silicon substrate comprising a silicon-germanium epitaxial layer comprising 30 to 60% germanium by weight percentage;
- forming a polysilicon layer on a channel region of the silicon-germanium epitaxial layer;
- implanting dopants into the silicon-germanium epitaxial layer using the polysilicon layer to define spaced apart source and drain regions adjacent the channel region;
- removing the polysilicon layer after the implanting to expose the channel region;
- forming a silicon epitaxial layer on the exposed channel region;
- converting 75 to 95% of a thickness of the silicon epitaxial layer into silicon oxide to define a gate oxide layer, the remaining silicon epitaxial layer forming a silicon protection layer between the gate oxide layer and the channel region; and
- forming a conductive gate on the gate oxide layer.

28. A method according to claim 27, wherein the silicon protection layer has a thickness in a range of about 0.5 to 2.5 nm.

29. A method according to claim 27, wherein the silicon epitaxial layer has a thickness in a range of about 0.5 to 3 nm.

30. A method according to claim 27, further comprising annealing the silicon substrate comprising the silicon-germanium epitaxial layer before forming the silicon epitaxial layer on the exposed channel region.

31. A method according to claim 27, wherein forming the silicon epitaxial layer is performed at a temperature less than about 600° C.

32. A method according to claim 27, wherein converting is performed using plasma enhanced chemical vapor deposition (PECVD).

33. A method according to claim 32, wherein the PECVD is performed at a temperature less than about 600° C.

34. A method according to claim 27, wherein converting is performed using oxidation at a pressure in a range of about 5 to 25 atmospheres.

35. A method according to claim 34, wherein the oxidation is performed at a temperature less than about 700° C.

* * * * *